United States Patent [19]
Wincn

[11] Patent Number: 5,276,716
[45] Date of Patent: Jan. 4, 1994

[54] BI-PHASE DECODER PHASE-LOCK LOOP IN CMOS

[75] Inventor: John M. Wincn, Cupertino, Calif.

[73] Assignee: Advanced Micro Devices Inc., Sunnyvale, Calif.

[21] Appl. No.: 595,522

[22] Filed: Oct. 11, 1990

Related U.S. Application Data

[63] Continuation-in-part of Ser. No. 480,426, Feb. 15, 1990, and a continuation-in-part of Ser. No. 595,068, Oct. 10, 1990, Pat. No. 5,164,960.

[51] Int. Cl.⁵ .............................................. H03D 3/24
[52] U.S. Cl. .................................. 375/120; 375/119; 331/1 A
[58] Field of Search .............. 375/81, 82, 97, 106, 375/119, 120; 331/1; 328/63, 72; 455/260, 180

[56] References Cited

U.S. PATENT DOCUMENTS

| | | | |
|---|---|---|---|
| 4,259,644 | 3/1981 | Iimura | 331/2 |
| 4,259,744 | 3/1981 | Junod et al. | 331/2 |
| 4,498,103 | 2/1985 | Aschwanden | 375/120 |
| 4,510,461 | 4/1985 | Dickes et al. | 331/2 |
| 4,534,044 | 8/1985 | Funke et al. | 331/1 A |
| 4,547,736 | 10/1985 | Takeda | 331/4 |
| 4,565,976 | 1/1986 | Campbell | 375/87 |
| 4,580,101 | 4/1986 | Lax | 375/81 |
| 4,590,602 | 5/1986 | Wolauer | 375/120 |
| 4,809,068 | 2/1989 | Nagai | 375/120 |
| 4,847,876 | 7/1989 | Baumbach et al. | 375/120 |
| 4,908,841 | 3/1990 | Leis et al. | 375/81 |
| 4,933,959 | 6/1990 | Knechtel | 375/120 |

OTHER PUBLICATIONS

Gardner, F. M., "Charge-Pump Phase-Lock Loops," *IEEE Transactions on Communications*, vol. Com-28, No. 11, pp. 1849-1858 (Nov. 1980).

*Primary Examiner*—Stephen Chin
*Attorney, Agent, or Firm*—Townsend and Townsend Khourie and Crew

[57] ABSTRACT

A bi-phase decoder for extraction of an embedded clock in a Manchester encoded signal operating at about ten megahertz. A phase-lock loop (PLL) includes a phase frequency detector and an interruptible voltage controlled oscillator (VCO). The PLL has a narrow bandwidth for stability to reduce effects of five megahertz components on clock extraction. The bi-phase decoder has a fast acquisition time to ensure frequency and phase lock during a preamble portion of an input data packet. A clock reference operates the PLL and the VCO at a nominal frequency of the embedded clock. Receipt of a data packet initiates interruption of the VCO operation to switch in the received data. The VCO resumes operation in phase with the received data packet and at about the proper frequency, therefore acquisition is fast. The VCO is designed to resume operation after operation at a particular phase to help in phase alignment.

7 Claims, 7 Drawing Sheets

BI-PHASE DECODER PHASE-LOCK LOOP IN CMOS

CROSS-REFERENCE TO RELATED APPLICATION

This is a continuation-in-part of Ser. No. 07/480,426, filed Feb. 15, 1990 entitled, "Twisted Pair Medium Access Unit," now U.S. Pat. No. 5,164,960, which is a continuation-in-part of Ser. No. 07/595,068, filed Oct. 10, 1990 entitled, "Bi-Phase Decoder Phase-Lock Loop in CMOS," now abandoned, both hereby expressly incorporated by reference.

BACKGROUND OF THE INVENTION

The present invention relates to phase-lock loops. Specifically, the invention relates to a phase-lock loop implemented in a complementary metal oxide semiconductor structure. The invention also relates to use of the phase-lock loop in an apparatus to extract an embedded clock in a Manchester-encoded data stream.

Manchester-encoded data, also referred to as a bi-phase signal, results from combining a clock signal with binary data through use of an Exclusive OR function. Encoding 10 megahertz data, for example, in this way produces a data stream having both 5 megahertz (MHz) and 10 MHz signals. The definition of Manchester-encoded data does not restrict an encoding frequency to 10 megahertz. A network which conforms to an IEEE 802.3 Standard requires an encoding frequency of 10 megahertz. A preferred embodiment of the present invention is useful for such a network.

Manchester-encoded data always has a transition in what as referred to as a bit-cell center. Other transitions may or may not occur at a bit cell boundary, depending on the data type. Therefore, it may be said that Manchester-encoded data has signal components at the data rate (10 megahertz, for example) and one half of the data rate (5 megahertz, for example)

To decode this Manchester-encoded data, a detector extracts the embedded clock signal. Combining the extracted clock signal with the encoded signal by forming the Exclusive OR logical sum, reproduces the data. Thereafter, the data and the clock signal are available. Extracting the clock requires that the data of the encoded Manchester signal be sampled in the second half of the bit cell, that is after the bit cell center. The Manchester-encoded signal includes an embedded clock signal, such as 10 megahertz. However, variation in this embedded clock signal will occur. The variation causes uncertainty in the sampling point of the encoded data.

Phase-lock loops track variations in frequency of an input signal. Phase-lock loops are used in circuitry to extract the clock from the Manchester signal. Since the valid Manchester-encoded data has both 5 MHz and 10 MHz components, conventional phase-lock loops cannot properly track the data. That is, if the phase-lock loop receives a succession of 10 MHz pulses followed by a 5 MHz pulse, the phase-lock loop attempts to track the 5 MHz and correct itself. If the 5 MHz pulse is followed by a 10 MHz pulse, the phase-lock loop again tries to correct itself. Alternation of the 5 and 10 MHz pulses results in the phase-lock loop trying to track the changing signal. Phase-lock loops have a characteristic known as bandwidth. The greater a bandwidth, the faster the phase-lock loop can respond to variations in an input signal's frequency. The smaller the bandwidth, the more stable and resistant to change is the phase-lock loop. It is possible with a large bandwidth, that inherent jitter in an encoded Manchester signal can combine with a fluctuating phase-lock loop to cause random sampling of the encoded Manchester signal. Random sampling of the Manchester signal results in incorrect data acquisition providing faulty operation. Therefore, use of small bandwidth circuits relatively immune to changes in input frequency provide insensitivity to frequency fluctuations and remain locked onto nominal 10 MHz components.

Conventional timing circuits frequently use one-shot circuits. Often, a starting edge of a pulse initiates an event. It is desirable to register receipt of a corresponding stop pulse. It is also desirable to register an excessive amount of elapsed time, indicating failure to receive a stop pulse. This one-shot timing is not conveniently done by use of clock signals. A problem results from the fact that many manufactured products cannot simultaneously compensate for voltage, current and capacitance differences which vary independently in these timing circuits. These variations occur from device to device and transistor to transistor of each device. A solution typically uses constant current sources because of the known relationship between current and capacitance represented by: $dv/dt = i/C$. If a constant current flows into a fixed capacitance, then a change of voltage over time will be constant. Phase-lock loop timing circuits having stable frequencies control these current sources to provide accurate timing. Therefore, variation in a phase-lock loop can disrupt timing sequences controlled by regulated current from the phase-lock loop. Therefore, variation in phase-lock loops are not desired.

A second problem in phase-lock loops, especially those having the desired narrow bandwidth, is that they usually have a slow acquisition time constant. An acquisition time constant is an indication of how long it takes for a phase-lock loop to adjust itself to coincide with an input frequency. The amount of time a phase-lock loop would take to go from 0 Hz frequency to 10 MHz is determinable in a well-known fashion. However, this finite amount of time is typically many orders of magnitude too long for use in devices decoding 10 MHz Manchester data corresponding to the IEEE specification 802.3. This specification is hereby expressly incorporated by reference. The IEEE specification 802.3 clearly identifies a maximum amount of time which a decoding device may add to a received data stream before it may output valid data. Most devices with a narrow bandwidth have a slow acquisition time which would add unacceptable amount of delay to decoding of data. As acquisition times become longer, introduced delays may be of sufficient magnitude that an entire manchester-encoded packet may be fully received and terminated before proper acquisition and decoding of the data by the phase-lock loop. Therefore, there is an inherent tension between a narrow bandwidth requirement and a fast acquisition time constant. The necessary fast acquisition time constant ensures that a phase-lock loop almost immediately locks onto the incoming signal. U.S. Pat. No. 4,565,976 to Campbell describes an interruptable voltage-controlled oscillator and a phase-lock loop using the voltage-controlled oscillator. The Campbell disclosure is useful for decoding Manchester data. The disclosure identifies a phase-lock loop which has a narrow bandwidth and a fast acquisition time. This disclosure hereby incorporates by reference the Campbell patent for all purposes.

The Campbell patent is useful in Manchester decoding apparatus because it establishes a narrow bandwidth phase-lock loop locked onto an external 10 MHz frequency source. When it is desired to decode an incoming Manchester signal, the phase-lock loop operating at the external 10 megahertz reference frequency is temporarily interrupted, the Manchester signal is switched in place of the external reference clock, and the phase-lock loop is then caused to resume operation at a specific phase of the Manchester signal. Thereafter, acquisition is virtually immediate as the phase-lock loop is operating at the nominal 10 megahertz frequency and the phase difference between the phase-lock loop and the embedded 10 megahertz Manchester-encoded clock is virtually zero. As the phase-lock loop has a narrow bandwidth, it is not susceptible to the 5 megahertz component and will continue sampling the data at the 10 MHz embedded clock frequency.

The Campbell invention uses a master-slave phase-lock loop configuration. The Campbell patent incorporates power intensive emitter coupled logic (ECL) to implement the invention. It is desired to provide a narrow bandwidth fast acquisition phase-lock loop from complementary metal oxide semiconductor (CMOS) structures. Additionally, elimination of structures in the Campbell implementation reduces component count.

SUMMARY OF THE INVENTION

The present invention provides method and apparatus for a master slave phase-lock loop in CMOS structure. The invention offers the advantage of decreased power consumption and a fewer part count. The reduction in part count provides for improved manufacturing reliability and decreased cost.

One aspect of the invention includes a phase-frequency detector coupled to a voltage-controlled oscillator by a filter network. An output of the voltage-controlled oscillator is scaled by a divide-by-four circuit and fed back to the phase-frequency detector. The phase-frequency detector includes a charge pump circuit controlling a current output. A Low-Pass Filter (LPF) network coupled between the voltage-controlled oscillator and the output of the phase-frequency detector receives charge when a feedback frequency lags an input reference frequency and the phase-lock loop needs a frequency increase. The phase-frequency detector removes charge from the LPF when the feedback frequency leads the input reference frequency a the phase-lock loop's frequency needs to decrease. An output frequency of the voltage-controlled oscillator is directly related to the input voltage provided by the LPF network. As the input voltage increases, the frequency of the output increases. A multiplexing circuit selects an input to the phase-frequency detector. The multiplexer, in response to a select signal, establishes either a received Manchester-encoded data or an external reference frequency for input to the phase-frequency detector. A control signal, coupled to the voltage-controlled oscillator, drives the voltage-controlled oscillator to a particular state and suspends its operation. A divide-by-four circuit improves resolution of the phase-lock loop circuit. Since the phase-frequency detector responds by detecting an error, the more sensitive the detector becomes to errors, the more readily it can adjust its output to correct the frequency. The output of the voltage-controlled oscillator is coupled to current sources for use in one-shot timing circuits mentioned above.

In operation, the phase-lock loop is made up of the phase-frequency detector, the LPF, and the voltage-controlled oscillator whose output is fed back to the detector through the divide-by-four network. The detector operates with an external reference having a precise frequency. This external frequency operates at 10 MHz, +/−0.01%, for use with Manchester-encoded data. Once the system is operating at 10 MHz and tracks the external reference, a control signal interrupts oscillator operation to configure oscillator output in a manner that upon resuming operation, the oscillator's signal's phase and frequency are precisely known. The preferred embodiment sets the phase of the divide-by-four for a negative going transition, and the frequency precisely at the external reference frequency.

The received Manchester-encoded data is a 5 megahertz preamble signal, that, through encoding, has an embedded 10 megahertz clock. Conventional circuitry may be used to determine when a transition of the Manchester-encoded signal is up or down. The Manchester-encoded data is directed to the detector through the multiplexer to the phase-frequency detector. When the Manchester-encoded data undergoes a negative transition, the control of the voltage-controlled oscillator allows its operation. As the circuit has a narrow bandwidth, interruption of the phase-lock loop permits very little change in the input voltage to the voltage-controlled oscillator. When the PLL resumes operation, it immediately begins operating at the 10 MHz nominal frequency of the external reference. The VCO is started in synchronized fashion with the Manchester data. Any initial differences in the signals of the Manchester 10 MHz component of the preamble and the initial external clock are quickly removed even though there is a narrow bandwidth. Therefore, once the data is received by the phase-lock loop, data may be extracted as described above. The narrow bandwidth permits the interruption of the voltage-controlled oscillator for sufficient time to substitute the received Manchester signal for the external reference and start operation without disturbing voltage level at an output of the LPF. If the voltage level at the output of the LPF does not change, it is impossible to cause the voltage-controlled oscillator to vary from its nominal 10 megahertz operation. This 10 MHz operation is sufficiently accurate to enable control over one-shot circuits used for timing purposes. Therefore, only a single phase-lock loop is necessary in the preferred embodiment.

Realizing a further understanding of the nature and advantages of the invention is possible by referring to the remaining portions of the specification and the drawing.

DESCRIPTION OF A SPECIFIC EMBODIMENT

TABLE OF CONTENTS
I. General
  A. Clock-receiver Structure
  B. Clock-receiver Operation
II. Phase-frequency Detector General Description
III. Voltage-controlled Oscillator General Description
IV. Phase-frequency Detector
  A. Detailed Structure
  B. Detailed Operation
V. Voltage-controlled Oscillator
VI. Low Pass Filter
VII. Scaling Circuit
VIII. Conclusion

I. General

A. Clock-receiver Structure

Figure 1:
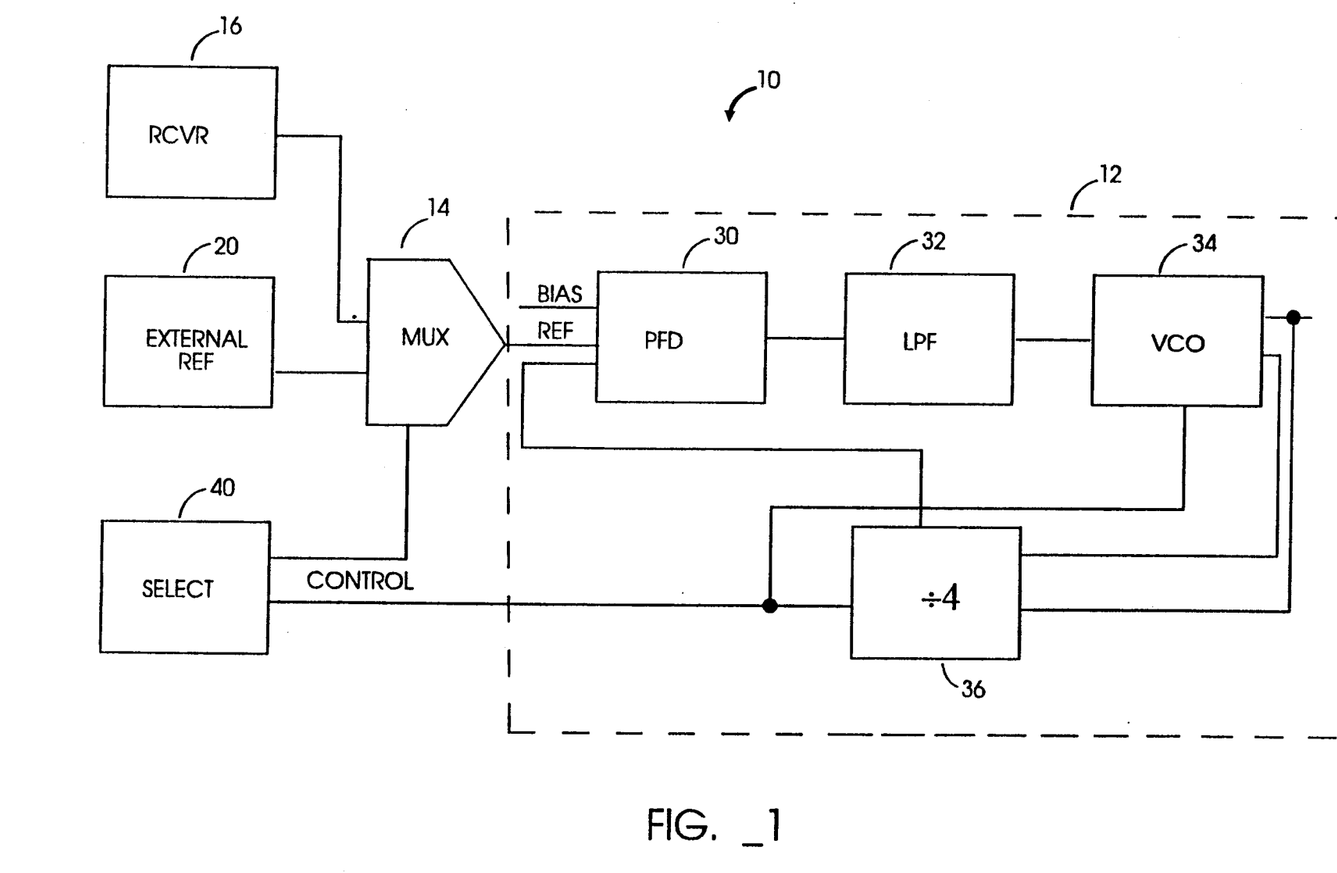
FIG. 1 is a schematic diagram of a receiving circuitry using the improved phase-lock loop.

FIG. 1 is a block diagram of a Manchester receiving circuit 10 including a single phase-lock loop (PLL) 12 receiving signals from a multiplexer 14 controlled by a select signal. Multiplexer 14 selects an output from either a receiver 16 or an external clock reference 20. The phase-lock loop is made up of a phase-frequency detector 30 having an output coupled to a filter 32 coupled in turn to a voltage-controlled oscillator 34. Output of the voltage-controlled oscillator is passed through a divide-by-four circuit 36 and returned as a feedback input into the phase-frequency detector 30. Note that the phase-frequency detector 30 not only is responsive to frequency differences but also to phase differences between a reference input and the feedback input. The select signal configures the multiplexer 14 to direct the external reference 20 to the reference line of the phase-frequency detector 30. The external reference is supplied with an internal crystal oscillator outputting a 10 MHz signal plus or minus 0.01 percent. Upon initiation, the feedback signal is zero while the reference is positive, this requires an increase in the feedback frequency. An output of the phase-frequency detector 30, filtered by the filter 32, is provided to the voltage-controlled oscillator 34. The voltage-controlled oscillator 34 is responsive to an input voltage to provide an oscillation frequency as described with reference to FIG. 4 below. As the voltage input to the voltage-controlled oscillator 34 increases, the output frequency increases as well. The output frequency drives the one-shots and timing circuits, not shown, as well understood. The output frequency is scaled by a scaling circuit 36 and fed back to the phase-frequency detector 30. The scaling circuit 36 in the preferred embodiment is a divide-by-four circuit. The output frequency of the voltage-controlled oscillator 34 is provided at four times the nominal reference frequency to provide needed decoding of the received Manchester signal. In feedback theory, it is well understood that the accuracy and amount of correction of feedback loop is directly related to the minimal amount of error detectable. A frequency four times as fast as the nominal incoming frequency permits finer resolution of the phase-lock loop. The phase-frequency detector 30 includes a bias line to provide bias current to activate the phase-frequency detector 30. Additionally, the VCO 34 includes a bias signal for supply of reference current to its circuitry. A control line is provided to the VCO 34 and to the scaling circuit 36 which is used to suspend operation of the VCO and the scaling circuit and to initiate their operation when it is desired to switch the reference signal from an external reference to the receiver 16. The control signal locks the VCO 34 to a known state. The known state in the preferred embodiment suspends operation until ready to resume a positive transition. The control line also resets scaling circuit 36 in anticipation of resumption of oscillation from the oscillator 34.

Associated with the VCO 34 is a particular gain which allows establishing the phase-lock loop LPF 32 values according to the Gardner reference incorporated herein.

B. Clock-receiver Operation

The external clock reference 20 oscillates at a nominal frequency of 10 MHz with a resolution of 0.01 percent. The multiplexer 14 responds to select signal, selects the external clock reference 20 provided to the reference input of the phase-frequency detector. The 10 MHz signal of the external reference is then compared to the feedback input of the phase-frequency detector to determine phase and frequency discrepancies between the reference and the feedback. Discrepancies detected between the reference input and the feedback cause a charge pump in the phase-frequency detector to either put charge in or take charge out of the filter 32. The addition of charge or extraction of charge from the filter controls the voltage applied to the voltage-controlled oscillator 34. The combination of the filter and the voltage-controlled oscillator 34 provide for a time constant. A desirable time constant may be established by reference to an article "Charge-pump phase-lock loops" by Floyd M. Gardner, IEEE Transactions on Communication, volume COM-28, no. 11, November 1980, page 1849. The article is hereby expressly incorporated by reference for all purposes. The input voltage of the voltage-controlled oscillator controls the oscillation frequency which is fed back to the detector. The oscillation frequency operates as a negative feedback causing the phase-frequency detector 30, the LPF 32, and the VCO 34 chain to remove differences between the reference and the feedback. Removal of the differences between the reference and the feedback signals establishes the frequency of the voltage-controlled oscillator at an appropriate multiple, in this case four, of the reference frequency. In the preferred embodiment, the voltage-controlled oscillator frequency is approximately 40 MHz, with 10 MHz being fed back to the detector 30.

Upon receipt of the Manchester-encoded signal by the receiver 16, the multiplexer 14, in response to the select signal, routes the Manchester signal to the reference input of the phase-frequency detector 30. The multiplexer 14 routes the Manchester-encoded signal to the phase-frequency detector during the preamble portion of the Manchester-encoded signal which is a 5 megahertz signal that the phase-lock loop may decode into a 10 megahertz clock and a 7-byte octet of alternating 1's and 0's upon correct sampling. A control circuit 40 times the shifting of the clock-receiver from the external reference to the Manchester-encoded signal to accurately align the phase of the voltage-controlled oscillator output with the incoming Manchester-encoded signal. That is, the voltage-controlled oscillator 34 resumes operation at the external reference frequency in phase alignment with the Manchester-encoded signal. Precise phase alignment, and very close frequency matching, permits the phase-lock loop 12 to quickly lock on to the preamble before the data portion of the Manchester-encoded packet arrives. The preamble will contain an embedded clock signal that is very close to the nominal 10 megahertz of the external reference 20 and acquisition of the embedded clock frequency of the preamble requires only a few bit times. Upon receipt of the data packet portion of the Manchester signal, the output frequency of the VCO helps to extract the data from the clock that is described above. The narrow frequency bandwidth resists responding to short term timing errors, or jitter, at the bit cell boundary. Therefore, the lock will remain upon the nominal 10 MHz embedded signal, with the extracted 10 MHz signal continuing to extract the data accurately. Upon completion of the data packet, the multiplexer 14 reselects the external clock reference 20 to maintain nominal 10 megahertz operation of the phase-lock loop 12 during an idle mode pending receipt of another preamble and data packet.

II. Phase-frequency Detector General Description

Figure 2:
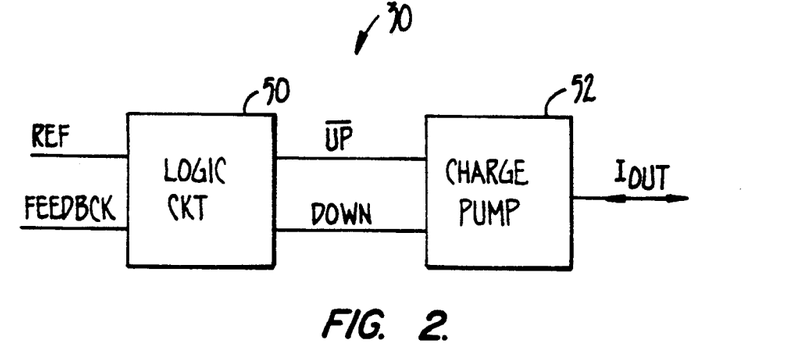
FIG. 2 is a block diagram of a phase-frequency detector according to the present invention.

FIG. 2 is a schematic diagram of the phase-frequency detector 30. The phase-frequency detector 30 includes a logic circuit 50 coupled to a charge pump 52. The logic circuit 50 receives both the reference signal and the feedback signal. The logic circuit 50 establishes the magnitude and direction of any phase or frequency error between these two signals. The logic circuit 50 provides an up signal ($\overline{UP}$) output or a down signal (DWN) output to indicate the error type in the feedback signal. That is, whether the voltage-controlled oscillator 34 is to increase or decrease the frequency of the feedback signal. $\overline{UP}$ is active low, meaning that assertion of the signal results from a binary zero. Assertion of $\overline{UP}$, that is reaching a binary zero level, indicates that the feedback frequency is slow and must have a higher oscillation frequency to remove timing and decoding error. Similarly, assertion of DWN indicates that the feedback frequency is fast and must have a slower oscillation rate to remove timing and decoding error. The charge pump 52 is responsive to the $\overline{UP}$ and the DWN signals to control a current out $I_{OUT}$ appropriately. $I_{OUT}$ may either be an output current or an input current, depending upon the values of $\overline{UP}$ and DWN signals. $I_{OUT}$, as described below, controls the input voltage to the voltage-controlled oscillator 34 by adding or removing charge from the LPF 32.

III. Voltage-controlled Oscillator General Description

Figure 3:
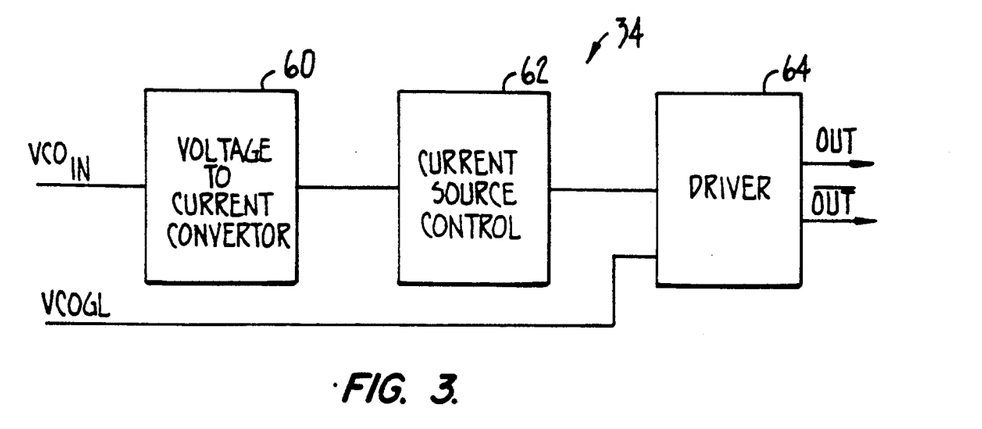
FIG. 3 is a block diagram of a voltage-controlled oscillator of the preferred embodiment.

FIG. 3 is a schematic diagram of the voltage-controlled oscillator 34 illustrated in FIG. 1. The voltage-controlled oscillator 34 includes a voltage-to-current converter 60 for receipt of an input voltage $VCO_{IN}$. The input voltage $VCO_{IN}$ controls, by use of the voltage-to-current converter 60, a current source 62 coupled in turn to a driver 64. The voltage-to-current converter 60 controls the magnitude of current available from the current source control 62 present in the driver 64. The driver 64 is responsive to the current levels to drive complementary output signals OUT and $\overline{OUT}$. The driver 64 is responsive to the current due to having a constant capacitance incorporated. The magnitude of the constant current from the current source control 62 determines a charge time of the capacitance. That is, as the current flow into the capacitor of the driver 64 is diminished by the voltage-to-current converter 60, the current requires a longer period of time to charge the capacitor. As the capacitor charge determines the oscillation frequency, a longer charge time decreases the oscillation rate. Conversely, an increase in current flowing into the capacitor charges the capacitor faster, driving the complementary output signals at a higher frequency.

IV. Phase-frequency Detector

A. Detailed Structure

Figure 4:
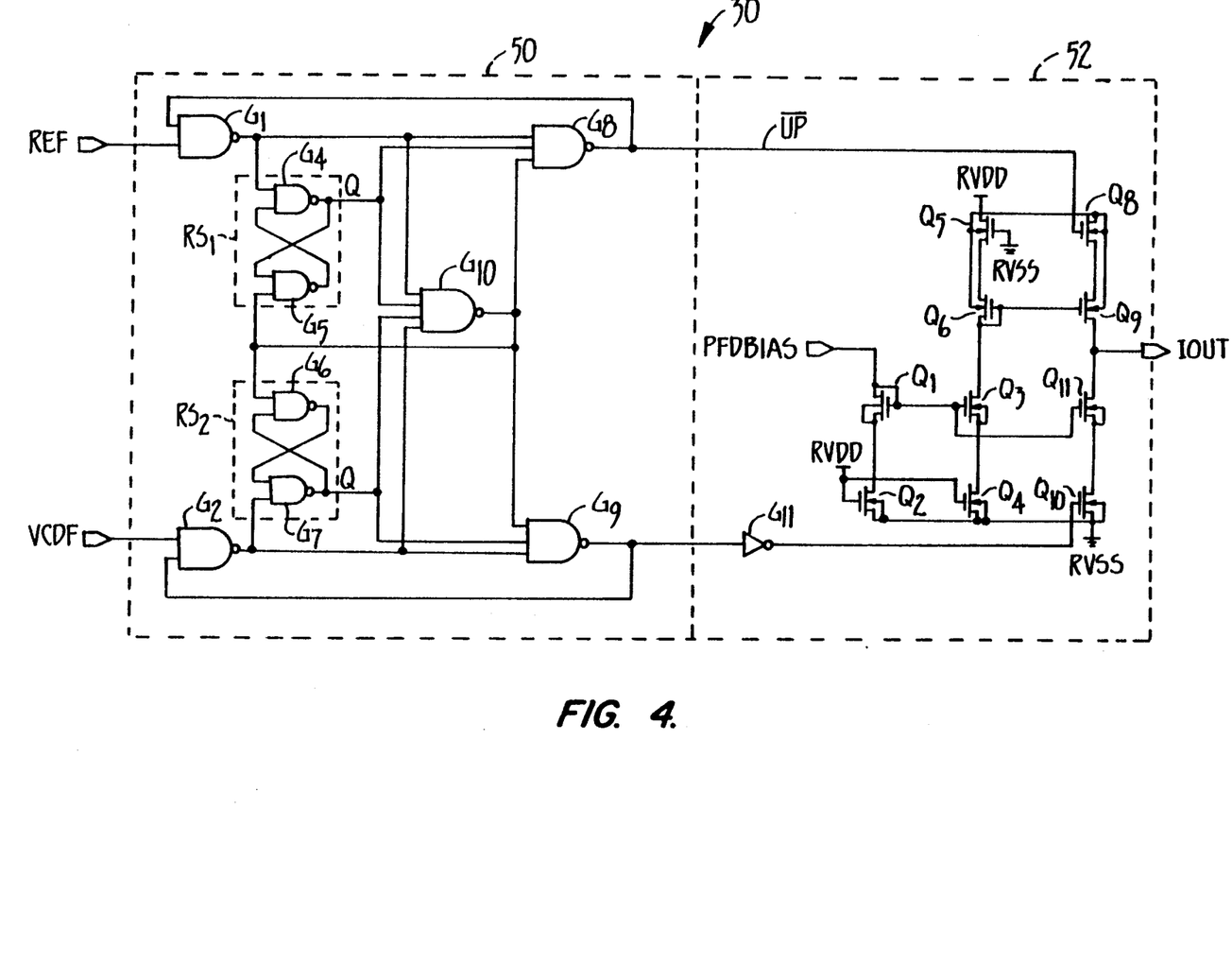
FIG. 4 is a detailed schematic of the phase-frequency detector.

FIG. 4 is a detailed schematic illustrating the phase-frequency detector 30. A 2-input NAND gate $G_1$ receives the reference voltage at one of its inputs. A dual input NAND gate $G_2$ receives feedback signal $VCO_f$ at one of its inputs. An output of NAND gate $G_1$ is coupled to a set terminal of an RS flip flop $RS_1$ made up of cross-coupled 2-input NAND gates $G_4$ and $G_5$. An output of NAND gate $G_2$ is coupled to a second RS flip-flop $RS_2$ made up of two dual-input NAND gates $G_6$ and $G_7$. RS flip-flops $RS_1$ and $RS_2$ have an output of one NAND gate returned to an input of the other NAND gate. Remaining inputs of the NAND gates, that is, an input of logic gate $G_4$ and logic gate $G_7$, act as set terminals of an RS flip-flop. The remaining terminals of $RS_1$ and $RS_2$, that is, inputs of $G_5$ and $G_6$, are interconnected and receive a reset signal driving an output of each respective RS flip-flop to zero. A 3-input NAND gate $G_8$ receives as one input, the output of logic gate $G_1$. A second input of NAND gate $G_8$ is received from an output Q of $RS_1$. Similarly, a 3-input NAND gate $G_9$ receives output of NAND gate $G_2$ at one input and another input receives output Q of $RS_2$. A 4-input NAND gate $G_{10}$ receives an input from the output of logic gate $G_1$ and receives a second input at an output of NAND gate $G_2$. Output Q of $RS_1$ is supplied to a third input while output Q of $RS_2$ is supplied to the fourth input of the 4-input NAND gate $G_{10}$. The 3-input NAND gate $G_8$ and 3-input NAND gate $G_9$ both receive at its third input an output from logic gate $G_{10}$. The output of the logic gate $G_{10}$ is also coupled to the reset terminals of $RS_1$ and $RS_2$. Logic gate $G_1$ receives as the second output an output from logic gate $G_8$. Similarly, logic gate $G_2$ receives as the second input an output from logic gate $G_9$. Logic gates $G_1$-$G_2$, $G_4$-$G_{10}$ make up logic circuit 50 of the phase-frequency detector 30. Output of $G_8$ function equates to the $\overline{UP}$ signal described above, while the DWN signal is asserted from the output of logic gate $G_9$. The charge pump 52 is made up of a set of complementary metal oxide semiconductor (CMOS) transistor devices $Q_1$ through $Q_{11}$. $Q_1$ through $Q_4$ make up a biasing network configured to selectively activate or deactivate the charge pump 52 portion of the phase-frequency detector 30. The MOS transistor $Q_5$ and $Q_6$ provide biasing for MOS transistors $Q_8$ and MOS transistor $Q_9$. The $\overline{UP}$ signal is coupled to a controlling gate of the transistor $Q_8$ and the DWN signal of the output of logic gate $G_9$ is inverted by logic gate $G_{11}$ and provided to a control gate of a MOS transistor $Q_{10}$. CMOS transistor $Q_{10}$ and CMOS transistor $Q_{11}$ are coupled to provide an apparatus to receive charge via an output $I_{out}$.

B. Detailed Operation

Figure 6A:
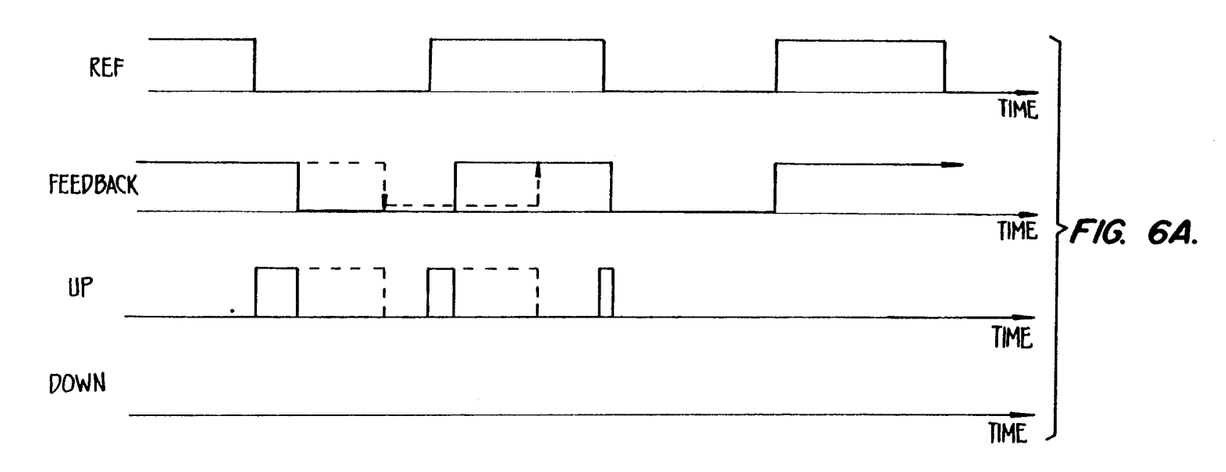
FIGS. 6A and 6B are timing diagrams illustrating several wave forms, including development of jitter in a Manchester-encoded signal and a typical Manchester-encoded data packet, and timing diagram showing operation of the phase-frequency detector.
Figure 6B:
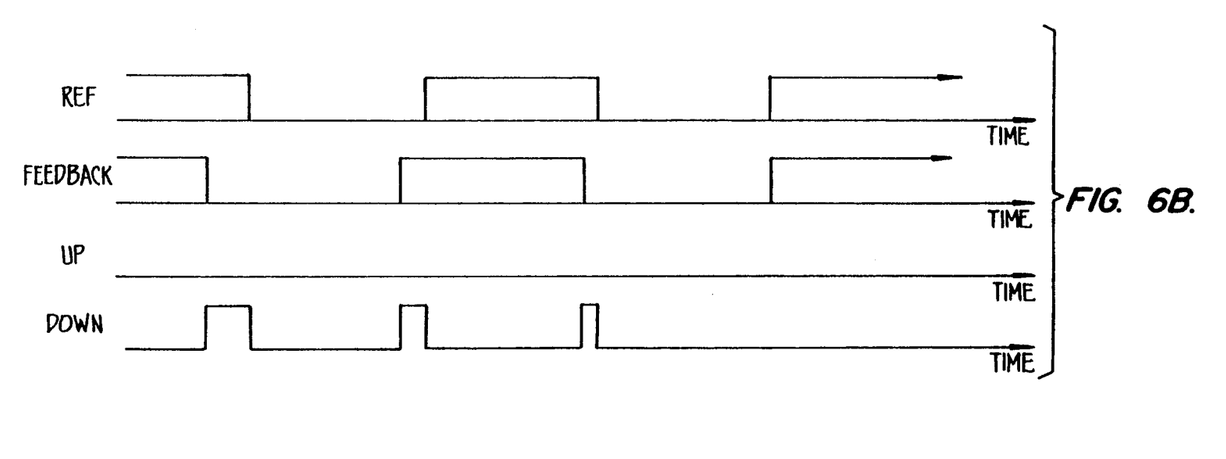

FIG. 6 is a set of timing diagrams illustrating operation of logic circuit 50. Specifically, FIG. 6A of the timing diagram showing the feedback signal lagging the reference signal while FIG. 6B is a timing diagram showing the reference signal lagging the feedback signal. Initially, both the reference and the feedback signal are asserted at a high level. This state provides a stable output of the logic circuit 50, that is, $\overline{UP}$ is asserted and DWN is asserted. Initially, with the output of $G_1$ deasserted, output of $RS_1$ is asserted. Deasserting the output of logic gate $G_1$ requires that the output of logic gate $G_8$ be asserted which is fed back to the second input of logic gate $G_1$. Also, the output of logic gate $G_8$ is used as the $\overline{UP}$ signal which is asserted. The negation of the output of logic gate $G_1$ negates the set input to $RS_1$ providing an assertion at Q of $RS_1$. Similarly, the relationship of $RS_2$, logic gate $G_2$ and logic gate $G_9$ is the same with assertion of the feedback signal and the second input being zero provides that the output of $G_9$ is asserted and returned to logic gate $G_2$. Output Q of $RS_2$ is asserted because of the input of the RS flip-flop. $G_{10}$ receives as inputs two asserted signal from the respective flip-flops and deasserted signals from the logic gates $G_1$ and $G_2$. These signals require that the output of $G_{10}$ be asserted which is returned to the reset terminals of RS flip-flops $RS_1$ and $RS_2$. Also, the output of $G_{10}$ is provided as an input to logic gate $G_8$ and $G_9$ which is mentioned above, is asserted. Unless the signal remains in the stable form and until the negative transition of either the reference signal or the feedback signal. FIG. 6A illustrates the instance when the reference signal has a transition before the feedback signal. In deasserting the reference signal into the logic gate $G_1$ asserts the output of logic gate $G_1$ provided to logic gate $G_8$ and $RS_1$ and logic gate $G_{10}$. $RS_1$ output Q remains asserted as does logic gate $G_{10}$ output. However, logic gate $G_8$ output is deasserted as the output of logic gate $G_1$ becomes asserted. Deasserting output of $G_8$ therefore indicates $\overline{UP}$ and provides negation to the second signal of $G_1$ making both signals deasserted. The output of logic gate $G_{10}$ remains asserted, however, because the input into logic gate $G_{10}$ from $RS_2$ remains unchanged staying deasserted. The negation of $RS_2$ requires the output of logic gate $G_{10}$ to remain asserted. Thus, the signal $\overline{UP}$ is deasserted, thereby asserting $\overline{UP}$. Signal $\overline{UP}$ remains deasserted until the feedback reference is deasserted as follows: Deasserting input of the feedback signal provides the logic gate $G_2$, asserts the output provided to $RS_2$, logic gate $G_9$ and $G_{10}$. Asserting all inputs of logic gate $G_9$ results in negation of the output, that is, the DWN signal. Additionally, the output of logic gate $G_9$ is fed back to the second input of logic gate $G_2$ thereby deasserting both inputs of logic gate $G_2$. Asserting the output of logic gate $G_2$ does not change the output of Q of $RS_2$ from an assertion signal. However, asserting the output of logic gate $G_2$ to logic gate $G_{10}$ results in assertion of all four signals to logic gate $G_{10}$ thereby deasserting the output of logic gate $G_{10}$ provided to the reset terminals of RS flip-flops $RS_1$ and $RS_2$. Deasserting the reset terminals resets the respective flip-flops which negate Q for both of the flip-flops. Resetting the output of Q of $RS_1$ provided to logic gate $G_8$ asserts the output of logic gate $G_8$ provided to logic gate $G_1$ as well as providing the $\overline{UP}$ signal. Thus, $\overline{UP}$ is now asserted once again upon the negative transition of the reference voltage. Similarly, negation of the Q output of $RS_2$ asserts the DWN signal provided at the output of logic gate $G_9$ which is also fed back to the input of logic gate $G_2$. Thus, upon the reference signal undergoing a transition from negation to assertion, negates the output of logic gate $G_1$ because both inputs are asserted. Reasserting the reference signal before the feedback signal sets the output of logic gates as they were before the negation of the signal. That is, logic gate $G_1$ output is deasserted, logic gate $G_8$'s output is asserted, RS flip-flop $RS_1$ output Q is asserted, and logic gate $G_{10}$ is asserted. Thus, $\overline{UP}$ is deasserted until the reference voltage is asserted as well. Thus, the logic circuit is sensitive to phase as well as frequency discrepancies for the reference signal for undergoing a transition before the feedback signal. When the reference signal transitions before the feedback signal, $\overline{UP}$ is deasserted until both the reference signal and the feedback signal has the same state. That is, until both are asserted or deasserted, respectively.

The timing diagram of FIG. 6B illustrates the second situation wherein a discrepancy exists, namely that a transition in the feedback signal occurs before the reference signal. In this instance, as the reader will understand, the DWN signal remains asserted for the duration of the transition discrepancy. Therefore, the logic circuit operates to provide a DWN signal for the duration of discrepancy of the feedback signal flagging the reference signal. Similarly, the logic circuit 50 operates to provide a down signal for the duration of timing discrepancy between a transition of the feedback signal and a corresponding transition of the reference signal. The signals $\overline{UP}$ and DWN are provided to the charge pump 52 to control the output current $I_{out}$. Negation of $\overline{UP}$ activates transitions $Q_8$ and $Q_9$ providing current at $I_{out}$. Similarly, assertion of the down signal activates transistors $Q_{10}$ and $Q_{11}$ providing a path to ground from $I_{out}$ which provides a source of current input at $I_{out}$. Thus, $I_{out}$ in response to the DWN signal is a negative current.

V. Voltage-controlled Oscillator

Figure 5:
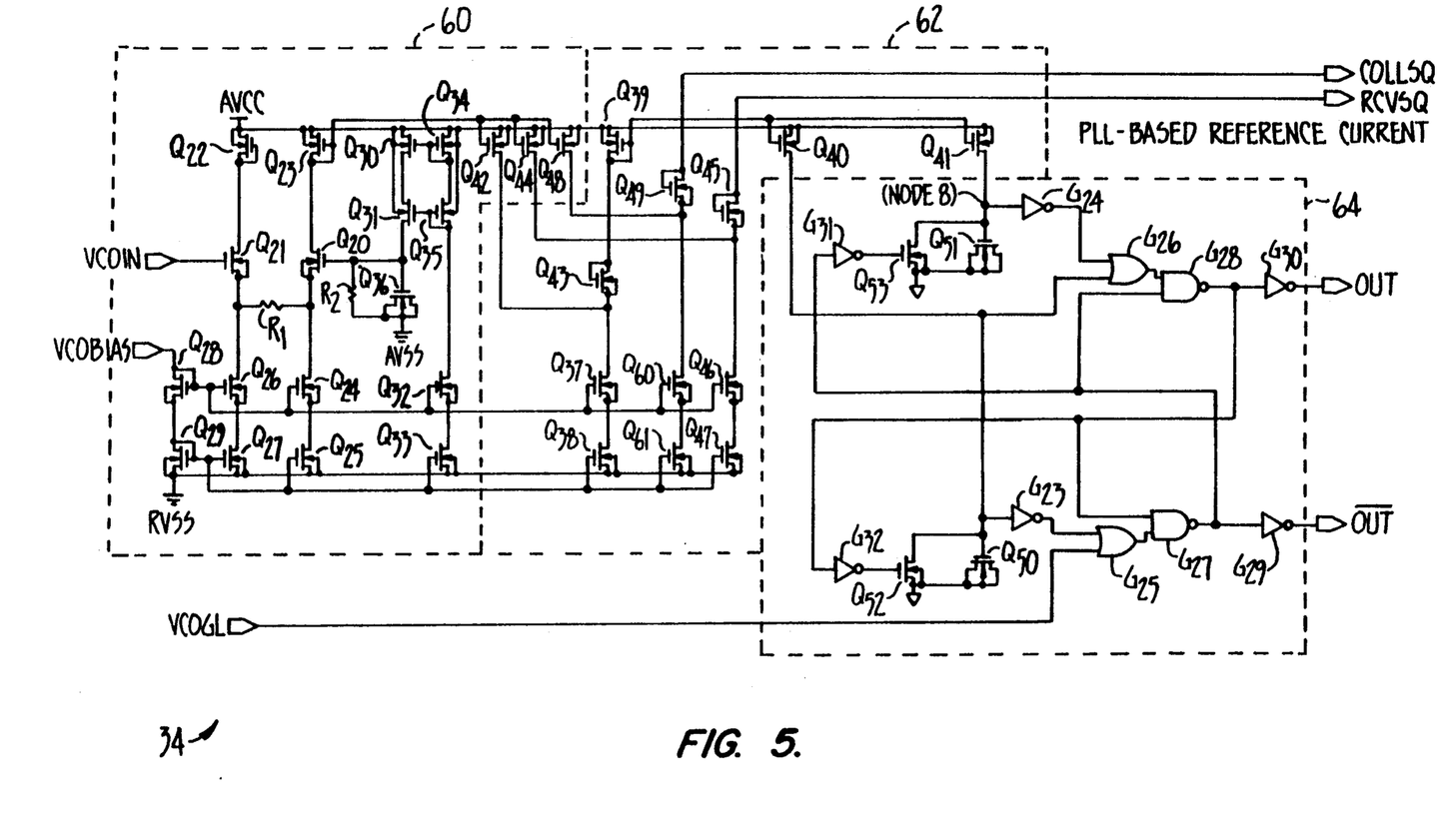
FIG. 5 is a detailed functional schematic of the voltage-controlled oscillator 34 of the preferred embodiment.

FIG. 5 is a detailed functional schematic of the voltage-controlled oscillator 34 of the preferred embodiment. Actual implementations of the particular functions depicted are manufacturing process dependent and may be particularly implemented in different ways as appreciated by a person of ordinary skill in the art. The voltage-controlled oscillator 34 includes the voltage-to-current converter 60 coupled to the current source control 62, which is coupled in turn to the driver 64. The voltage-to-current converter 60 includes a differential amplifier having two inputs. One input has its reference established at a voltage level approximating mid supply. An input voltage from the low pass filter 32 produces an output voltage proportional to the difference between the reference voltage and the input voltage at the gate connection of $Q_{23}$ as is well understood in the art. An impedance R1 in the differential amplifier effects its gain to decrease the amplifier's output response in response to changes in the input voltage. Coupling between $Q_{23}$ and $Q_{42}$, $Q_{44}$ and $Q_{48}$ converts the differential amplifier's voltage output to a current output.

Specifically, a transistor $Q_{20}$ includes a gate input whose input serves as the reference input for the differential amplifier made up of the transistor $Q_{20}$ and a plurality of transistors $Q_{21}$-$Q_{27}$. The transistor $Q_{21}$ has a gate input receiving the input voltage, VCOIN. The transistor $Q_{20}$ and the transistor $Q_{21}$ include source terminals coupled to each other by a resistor R1. The resistor R1 serves to decrease the gain of the differential amplifier and therefore acts as a gain limiting impedance. Current sources for the transistors $Q_{20}$ and $Q_{21}$ provide bias to the differential amplifier. A transistor $Q_{24}$ has a source connected to a drain of a transistor $Q_{25}$ and a drain connected to the source of the transistor $Q_{20}$. The transistor pair $Q_{24}$ and $Q_{25}$ bias the transistor $Q_{20}$. Similarly, a transistor $Q_{26}$ has a source connected to a drain of a transistor $Q_{27}$ and a drain connected to the source of the transistor $Q_{21}$. The transistor pair $Q_{26}$ and $Q_{27}$ bias the transistor $Q_{21}$. Sources of the transistors $Q_{22}$ and $Q_{23}$ connect to a first voltage which in the preferred embodiment is 5 volts, for example. Drain terminals of the transistors $Q_{20}$ and $Q_{23}$ connect to each other and the drain terminals of the transistors $Q_{21}$ and $Q_{22}$ connect to each other. The source terminal of the transistor $Q_{22}$ connects to the supply voltage while the gate terminal of the transistor $Q_{23}$ connects to its drain terminal. Thus, the combined transistors $Q_{20}$ and $Q_{23}$ provide the output voltage of the differential amplifier.

A pair of gate-drain connected transistors, $Q_{28}$ and $Q_{29}$, in response to an input bias signal VCOBIAS, enable operation of the current sources of the voltage-to-current converters. The source of the transistor $Q_{28}$ connects to the drain of the transistor $Q_{29}$. The source of the transistor $Q_{29}$ connects to a second voltage level less than the supply voltage, which in the preferred embodiment is zero volts, for example. The gate of the transistor $Q_{28}$ connects to the gates of the transistor $Q_{24}$ and to the transistor $Q_{26}$. The gates of the transistors $Q_{25}$ and $Q_{27}$ connect to the gate of the transistor $Q_{29}$. The transistor $Q_{28}$ receives the VCOBIAS signal at its drain input.

A current source provided to an impedance and filtered by a capacitance biases the gate of the transistor $Q_{20}$ to about a voltage level midway between the first and second voltages. In the preferred embodiment, this bias voltage is approximately 2.5 volts. Six transistors, $Q_{30}$ through $Q_{35}$ operate to provide a current source through the resistor R2. Proper selection of the value of R2 given the current magnitude of the current source enables the gate of the transistor $Q_{20}$ to have a reference voltage about equal to 2.5 volts, in the preferred embodiment. Transistors $Q_{32}$ through $Q_{35}$ produce a control voltage for the transistors $Q_{30}$ and $Q_{31}$ which provide the current through the resistor R2. A transistor $Q_{36}$ having its drain and source connected to the second supply voltage effectively provides a capacitance input at its gate. This capacitance acts as a low pass filter to control the reference input.

In operation, as VCOIN moves relative to the reference voltage, the transistor $Q_{20}$ drives either more or less current at the gate of the transistor $Q_{23}$. As VCOIN increases, the current delivered to $Q_{23}$ decreases. Vice versa, as VCOIN decreases, the current delivered to $Q_{23}$ increases.

The voltage-to-current converter 34 includes the current source control circuit 62 which includes a current source provided by a set of transistors, $Q_{37}$ through $Q_{41}$. The transistor $Q_{37}$ and $Q_{38}$ respond to the enabling transistors $Q_{28}$ and $Q_{29}$. The transistor $Q_{39}$ produces a constant voltage bias to the transistors $Q_{40}$ and $Q_{41}$. Current from the transistors $Q_{40}$ and $Q_{41}$ will therefore be equal and the current supplied to the driver 64 by these transistors will be in a fixed ratio to the current delivered to $Q_{39}$. The driver 64 uses these currents in timing circuits to control the oscillation rate. A transistor $Q_{42}$ has its source coupled to the first voltage level, its drain coupled to the drain of $Q_{37}$ and its gate coupled to the gate of the transistor $Q_{23}$. The transistor $Q_{42}$ controls the amount of current delivered to the transistor $Q_{39}$.

As indicated above, the voltage output of $Q_{23}$ increases or decreases depending upon the value of the VCOIN signal. As the output voltage of the transistor $Q_{23}$ increases, the transistor $Q_{42}$ diverts more current from the current source $Q_{37}$ and $Q_{38}$ than before the voltage increase at the transistor $Q_{23}$. The current from the transistor $Q_{42}$ diverts current from the current source by adding current negatively into the current source, thereby producing less output current from the current source. Diversion of more current means that the transistors $Q_{40}$ and $Q_{41}$ will provide less current to the timing circuits. Later discussion will illustrate that as the output frequency of the voltage-controlled-oscillator 34 is directly dependent upon the value of the currents from the transistors $Q_{40}$ and $Q_{41}$. That is, as more current is available, the VCO 34 frequency will increase. Thus, as VCOIN increases, the VCO 34 increases.

Vice versa, as the voltage of $Q_{23}$ decreases, the transistor $Q_{42}$ diverts less current from the current source, leaving more current available for the transistors $Q_{40}$ and $Q_{41}$. Thus, the oscillation rate of the VCO 34 will slow down in response to the decrease in VCOIN and speed up in response to an increase in VCOIN.

A gate-drain connected transistor $Q_{43}$ is provided in series with the current source to enhance operation of the VCO 34 over a frequency range wider than obtainable without its use. The transistor $Q_{42}$, when operating in its saturated mode, has a current flow virtually exclusively dependent upon its own gate to source voltage. The transistor $Q_{42}$ also includes a triode mode, wherein its drain current is a function of its drain-to-source voltage in addition to its gate to source voltage. For low frequency operation, without the transistor $Q_{43}$, the transistor $Q_{42}$ has a tendency to operate in the triode region, rendering the output current of the transistor $Q_{42}$ somewhat non-linear in response to the transistor $Q_{23}$ output. Therefore, by addition of the transistor $Q_{43}$, the transistor $Q_{42}$ operates in the saturation mode for lower VCOIN signals. Thus, the VCO 34 is operable over a wider frequency range.

The transistors $Q_{44}$ through $Q_{49}$ and $Q_{60}$ and $Q_{61}$ are two circuits equivalent to the transistors $Q_{37}$-$Q_{39}$ and $Q_{42}$ in operation and structure. The two circuits respond to the output of the transistor $Q_{23}$ to produce a controlled current output for use in timing circuits as indicated above. The circuits are isolated from the transistors $Q_{40}$ and $Q_{41}$ to help eliminate crosstalk generated by the driver circuit 64.

Driver 64 is responsive to the output voltages at the output nodes to provide complementary output oscillations controlled by the voltage input into the voltage to current converter 60. Additionally, the driver 64 is responsive to a VCO control signal to set the driver 64 into a known condition. The driver circuit 64 drives complementary signals from the VCO 34 in response to the output currents of the transistors $Q_{40}$ and $Q_{41}$. The drains of these transistors connect to capacitors $Q_{50}$ and $Q_{51}$, respectively, formed similarly to transistor $Q_{36}$. The drain and source of the transistors $Q_{50}$ and $Q_{51}$ connect to the second voltage level. A transistor $Q_{52}$ connects its drain to the gate of the transistor $Q_{50}$ and its source to the second voltage level. Similarly, a transistor $Q_{53}$ connects to the gate and source of the transistor $Q_{51}$. An invertor $G_{23}$ and $G_{24}$ have an input terminal coupled to the gate of the transistor $Q_{50}$ and $Q_{51}$, respectively. Dual input OR gates $G_{25}$ and $G_{26}$ have a first input coupled to an output of invertors $G_{23}$ and $G_{24}$, respectively. Dual input NAND gates $G_{27}$ and $G_{28}$ have a first input coupled to an output of the OR gate $G_{25}$ and $G_{26}$ respectively. An invertor $G_{29}$ has an input coupled to an output of the NAND gate $G_{27}$ while an invertor $G_{30}$ has an input coupled to an output of the NAND gate $G_{28}$. The output of the invertors $G_{29}$ and $G_{30}$ provide complementary outputs of the VCO 34. The output of the NAND gate $G_{27}$ couples to the second input of the NAND gate $G_{28}$ and to an input of an invertor $G_{31}$ having an output coupled in turn to a gate of the transistor $Q_{53}$. Similarly, the output of the NAND gate $G_{28}$ couples to the second input of the NAND gate $G_{27}$ and to an input of an invertor $G_{32}$ having an output coupled to a gate of the transistor $Q_{52}$. The VCOGL signal connects to the second input of the OR gate $G_{25}$ while the gate of the transistor $Q_{50}$ couples to the second input of the OR gate $G_{26}$.

To suspend operation of the VCO 34, a control circuit asserts VCOGL. Assertion of VCOGL causes the combinatorial logic to stabilize with the output of $G_{29}$ asserted and the output of $G_{30}$ deasserted. Upon a deassertion of VCOGL, and after four gate delays of $G_{25}$, $G_{27}$, $G_{28}$ and $G_{30}$, the invertor $G_{30}$ asserts its output. Similarly, invertor $G_{29}$ deasserts its output shortly thereafter.

During operation, the voltage output of the VCO is controlled by the currents provided from the transistors $Q_{40}$ and $Q_{42}$. At any particular time, the invertor $G_{31}$ and the invertor $G_{32}$ are in opposite states. One-half cycle later, the invertors $G_{31}$ and $G_{32}$ have changed states. Therefore, the discussion of the timing circuit made up the invertors $G_{24}$ and $G_{31}$, the transistors $Q_{51}$ and $Q_{53}$ and a current source $Q_{41}$ will also describe operation of the timing circuit coupled to the transistor $Q_{40}$.

Figure 9:
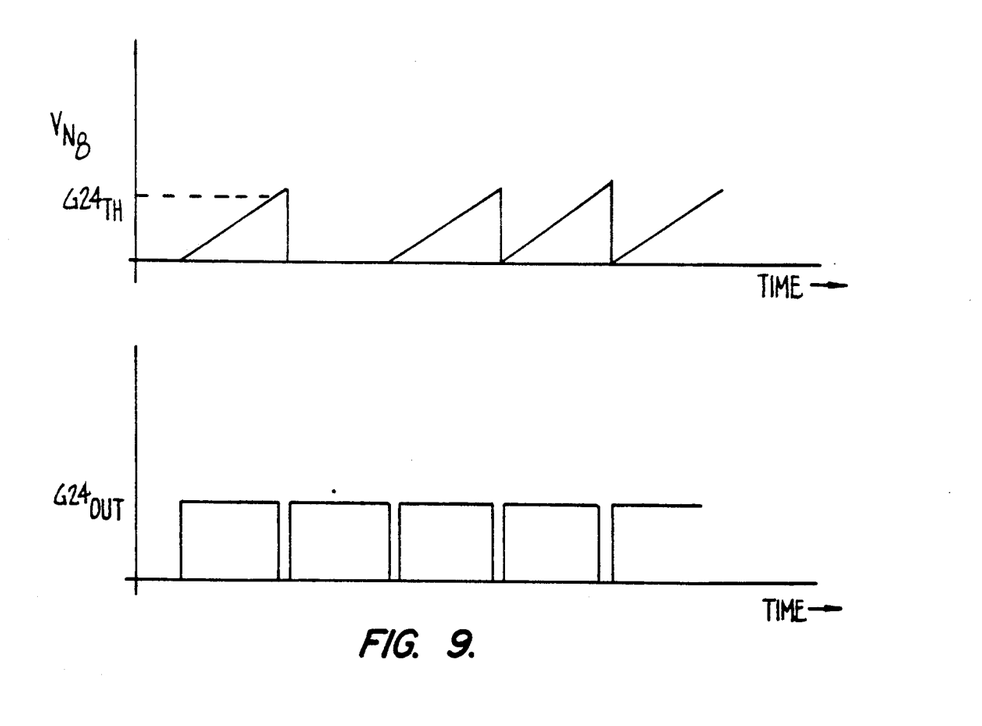
FIG. 9 is a set of timing diagrams illustrating a relationship between the input voltage of the invertor G24 (node 8) and the output of the invertor G24.

Invertor $G_{31}$ initially asserting its output to the gate of the transistor $Q_{53}$ causes the transistor $Q_{53}$ to short the capacitor made up of the transistor $Q_{51}$. This shorted capacitor cannot increase its voltage level in response to the current from the transistor $Q_{41}$, thereby asserting the output of the invertor $G_{24}$. An assertion of the input of the invertor $G_{31}$ turns the transistor $Q_{53}$ off allowing the capacitor transistor $Q_{51}$ to begin to charge. As is well known, the rate of charge dQ of a capacitor is a function of the current. Thus, as current from the transistor $Q_{41}$ charges the capacitor $Q_{51}$, the voltage level at the input of the invertor increases. Since the current delivered by $Q_{41}$ is constant, and since the gate capacitance of $Q_{51}$ is constant, the voltage at the input to $G_{26}$ rises linearly. FIG. 9 is a set of timing diagrams illustrating a relationship between the input voltage of the invertor $G_{24}$ (node 8) and the output of the invertor $G_{24}$. As shown, the voltage at node 8 rises linearly and passes the threshold level of the invertor $G_{24}$. When the voltage at node passes the threshold, the invertor $G_{24}$ deasserts its output. The voltage at node continues to rise until the deassertion of the invertor $G_{24}$ output propagates through the driver, ultimately driving the voltage at node to zero.

At the threshold of the invertor, approximately midway between the first and second voltages, which for the preferred embodiment is about 2.5 volts, for example, the invertor $G_{24}$ changes state deasserts its output. This deassertion propagates through the logic to change the state of the output which toggles the other timing circuits input invertor, either $G_{31}$ or $G_{32}$, as appropriate. The outputs of the two invertors $G_{29}$ and $G_{30}$ in the preferred embodiment of the present invention produce a set of non-overlapping clocks that are complementary except during a transistion.

VI. Low Pass Filter

Figure 7:
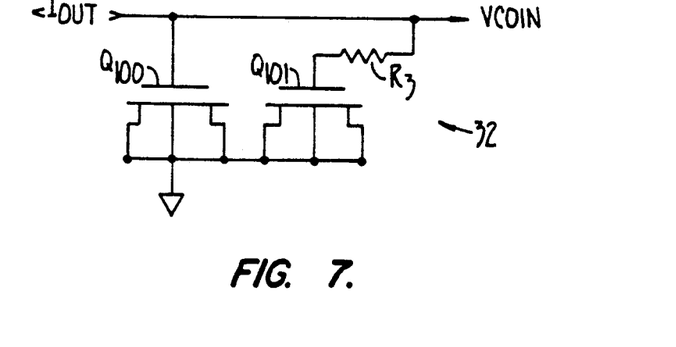
FIG. 7 is a schematic diagram of the filter 32 having a first transistor $Q_{100}$ and a second transistor $Q_{101}$ connected as capacitors.

FIG. 7 is a schematic diagram of the filter 32 having a first transistor $Q_{100}$ and a second transistor $Q_{101}$ connected as capacitors. Transistor $Q_{100}$ has a gate terminal connected to a node coupled to $I_{OUT}$ and $VCO_{in}$. A second transistor $Q_{101}$ has its gate terminal connected through a resistor $R_3$ to the node. The first and second terminals and substrate of transistors $Q_{100}$ and $Q_{101}$ are all connected to the second voltage level. Operation of the filter 32 coupled to the resistors $R_1$ of the voltage-controlled oscillator 34 provide a narrow bandwidth filter providing stability to the phase-lock loop 12.

VII. Scaling Circuit

Figure 8:
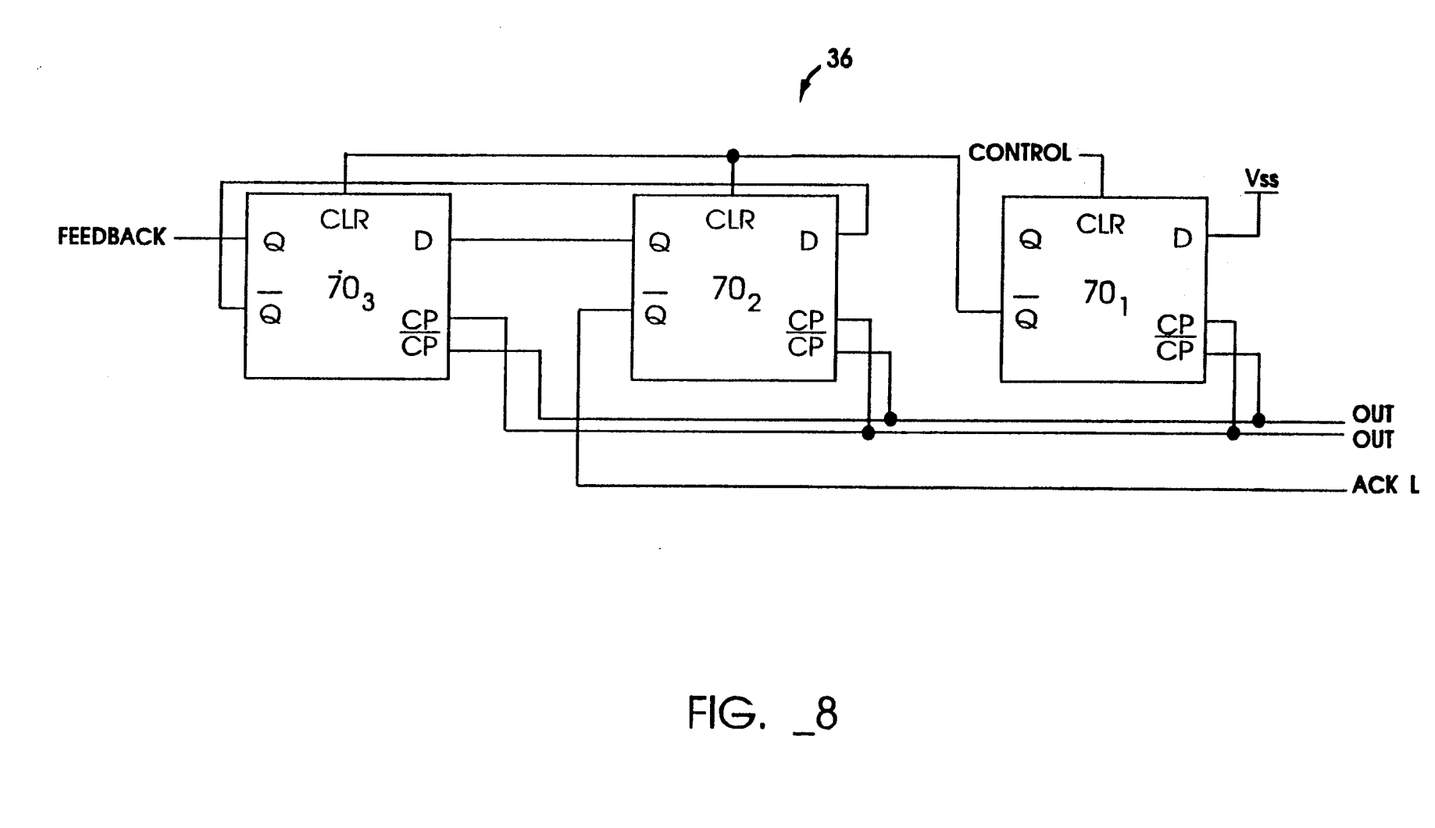
FIG. 8 is a schematic block diagram of the scaling circuit 36 having a plurality of the flip flops $70_1$.

FIG. 8 is a schematic block diagram of the scaling circuit 36 having a plurality of the flip flops $70_1$. The first D flip flop $70_1$ receives the VCO control signal at a clear input and has a data input coupled to the supply. The first D flip flop $70_1$ is responsive to complementary clock signals CP and $\overline{CP}$. Upon assertion of CP and negation of $\overline{CP}$, data at the D terminal is latched at the Q output while complement of Q is latched at the $\overline{Q}$ output. $\overline{Q}$ output of the first D flip flop $70_1$ supplies the clear signal to the second D flip flop $70_2$ and the third D flip flop $70_3$. The clock input CP of the first D flip flop is received from the complementary output of the driver circuit 64 of the voltage-controlled oscillator 34 while the complementary clock input is received from the output of the driver 64 of the voltage-controlled oscillator 34. The second D flip flop $70_2$ and the third D flip flop $70_3$, however, receive as their clock inputs and complementary clock inputs the output and complementary output respectively, from the driver 64 of the voltage-controlled oscillator 34. The output of the second D flip flop $70_2$ supplies the data input for the third D flip flop $70_3$ while the complementary output of the third D flip flop $70_3$ provides the data for the second D flip flop $70_2$. Output of the third D flip flop $70_3$ is the output of the scaling circuit 36 which is provided to the feedback of the phase-frequency detector or 30.

In operation, before actuation of the scaling circuit, the control signal is asserted to clear the first D flip flop $70_1$. Clearing the first D flip flop $70_1$ asserts complementary output $\overline{Q}$ of the first D flip flop $70_1$ thereby clearing the second D flip flop $70_2$ and the third D flip flop $70_3$. Clearing the second and third D flip flops negates the Q outputs providing a deasserted signal as the feedback signal to the detector. A clock line RCKL provides appropriate timing for decoding the received Manchester signal and is tapped from the $\overline{Q}$ output of the second D flip flop $70_2$.

When an incoming Manchester signal has been received in its negative going transition and is ready to be asserted, the VCO control is deasserted thereby permitting the first D flip flop $70_1$ to operate in response to the output signals of the driver 64 of the voltage-controlled oscillator 34. From the complementary output of the driver circuit 64, Q is asserted, thereby deasserting $\overline{Q}$ (of the first D flip flop $70_1$. Deasserting $\overline{Q}$ removes the clear signal from the second D flip flop $70_2$ and the third D flip flop $70_3$. Thus, these second and third D flip flops are responsive to clock signals received from the driver of circuit 64. When the output signal of the driver 64 is asserted, the asserted output of $\overline{Q}$ from the third D flip flop $70_3$ is latched into the output Q of the second D flip flop $70_2$ while the deasserted output of Q is latched into the Q output of the third D flip flop $70_2$. The $\overline{Q}$ output is then deasserted and provided to the D input of the second D flip flop $70_2$. The next assertion of the output of the driver 64 latches a low input at Q of $70_3$ and a high input at Q of $70_2$. The high input of $\overline{Q}$ of $70_3$ is returned to the D input of the second D flip flop $70_2$. Thereafter, the third and fourth assertions of the output of driver 64 provide high outputs of the third D flip flop $70_3$ having the $\overline{Q}$ output of $70_3$ returned to the D flip input of the second D flip flop $70_2$. Therefore, after four assertions of the output of the driver 64 of the voltage-controlled oscillator 34, a single output transition from zero to one and back to zero has been provided from the third D flip flop $70_3$ provided to the feedback input of the phase-frequency detector 30. Thus, the configuration of the second D flip-flop $70_2$ and the third D flip-flop $70_3$ operate as a divide-by-four circuit whose operation is controlled by the first D flip-flop $70_1$. Note that the second and third D flip-flop $70_2$ and $70_3$ respectively, will only be cleared and rendered inoperative upon assertion of the VCO control signal of the first D flip-flop $70_1$.

In conclusion, the present invention significantly improves upon the prior art. The present invention provides a single phase-lock loop in place of a master slave phase-lock loop combination used in the prior art. In addition, the present phase-lock loop is operable with CMOS transistors resulting in reduced power consumption for use and improved function as the prior art, that is, decoding a Manchester-encoded data signal. While the above is a complete description of the preferred embodiments on the invention, various alternatives, modifications, and equivalents may be used. Therefore, the above description does not limit the scope of the invention. The appended claims define the scope.

What is claimed is:

1. A bi-phase receiver, comprising:
   a phase-lock loop including:
   a phase-frequency detector having a first input, a second input and an output;
   a filter having an input and an output, said filter input coupled to said detector output; and
   a voltage-controlled oscillator having an input and an output, said oscillator producing a first output signal having a first frequency to said second input of said detector, said first frequency responsive to an input voltage provided from said filter at said oscillator input, said voltage-controlled oscillator including means for controlling said first output signal to suspend oscillation in response to an assertion of a first control signal and to resume oscillation at a particular phase in response to a deassertion of said first control signal;
   a receiver for receipt of an encoded signal, said receiver having an output, and said encoded signal having an embedded clock oscillating at about a second frequency;
   a clock generator providing a second output signal having an output oscillation frequency about equal to said second frequency;
   a multiplexer, having a first input coupled to said receiver's output and a second input coupled to said clock generator to receive said second output, said multiplexer responsive to a second control signal for selecting one of said multiplexer inputs to route an output coupled to said first input of said phase-frequency detector; and
   a control circuit for asserting said first and second control signal to operate said phase-lock loop at said clock generator oscillation frequency by routing said second output signal to said phase-frequency detector until said embedded clock is to be extracted, at which time said control circuit asserts said first control signal to suspend operation of said phase-lock loop and said second control signal routes said incoming signal to said phase-frequency detector and said control circuit negates said first control signal to resume said phase-lock loop oscillation output signal in phase alignment with said incoming clock signal.

2. A phase-lock loop, comprising:
   a phase-frequency detector having a first input, a second input and an output, said first input for receiving an incoming clock signal and said second input for receiving a feedback clock signal;
   a first coupled to said output of said phase-frequency detector; and
   a voltage-controlled oscillator having an input coupled to an output of said filter and having an output coupled to said second input of said phase-frequency detector, and further including means, responsive to a control signal, for interrupting operation of said voltage-controlled oscillator for locking in a reference frequency and resuming oscillation of said interrupted voltage-controlled oscillator at said reference frequency with a desired phase and frequency relationship to said incoming clock signal.

3. A method for extracting a clock having a particular frequency from and incoming clock signal comprising the steps of:
   providing a phase-lock loop with an interruptible voltage-controlled oscillator operating at a first frequency and responsive to a control signal to define a resumptive oscillation at a particular phase and frequency about equal to said first frequency wherein an assertion of said control signals interrupts said voltage-controlled oscillator to lock in a reference frequency;
   providing a clock reference having a nominal second frequency about equal to the particular frequency of the incoming clock signal;
   locking said phase-lock loop onto said clock reference to operate said phase-lock loop at said second frequency;
   asserting said control signal to lock in said second frequency as said reference frequency;
   substituting the incoming clock signal for the reference clock; and
   resuming operation of the voltage-controlled oscillator at about said reference frequency about in phase and frequency with the particular frequency of the incoming clock signal.

4. A circuit, comprising:
a receiver for receipt of a first signal having an embedded clock signal, said embedded clock signal having a nominal frequency;
a reference for providing a second signal having a reference frequency about equal to said nominal frequency;
a multiplexer for providing a reference signal, said multiplexer having a first input coupled to said receiver and a second input coupled to said reference, said multiplexer responsive to a second signal for selecting said first signal as said reference signal when said select signal is asserted and for selecting said second signal as said reference signal when said select signal is deasserted;
a phase-lock loop, comprising:
a phase-frequency detector having a first input coupled to said multiplexer for receiving said reference signal, said phase-frequency detector having a second input for receipt of a feedback signal, said phase-frequency detector providing an error signal responsive to a phase and frequency difference between said reference signal and said feedback signal;
a filter, coupled to said phase-frequency detector, for converting said error signal into a voltage level; and
a voltage-controlled oscillator coupled to said filter and responsive to said voltage level to generate said feedback signal to said second input of said phase-frequency detector, said voltage-controlled oscillator generating said feedback signal having an oscillation frequency, said voltage-controlled oscillator responsive to an assertion of a control signal to stop generating said feedback signal and to lock in a particular frequency of said feedback signal and further responsive to a deassertion of said control signal to resume generation of said feedback signal at said particular frequency with a particular phase; and a selector, coupled to said multiplexer and to said voltage-controlled oscillator, for asserting and deasserting said select signal and said control signal.

5. The circuit according to claim 4 wherein said selector comprises:
first means for deasserting said select signal to said multiplexer to select said second signal as said reference signal;
first means for asserting said control signal when said receiver receives said first signal to lock in said reference frequency as said particular frequency;
second means, coupled to said first deasserting means, for asserting said select signal to said multiplexer to select said first signal as said reference signal; and
said means, coupled to said first asserting means, for deasserting said control signal when said first signal and said particular phase have a predetermined relationship to each other.

6. The circuit according to claim 4 wherein the circuit is an integrated circuit and said phase lock loop includes complementary metal oxide semiconductor transistors.

7. A method for locking a phase-lock loop circuit to an embedded clock signal in an input signal, wherein the embedded clock signal has a nominal frequency, comprising the steps of:
multiplexing a reference signal, having a reference frequency about equal to the nominal frequency, to the phase-lock loop circuit;
locking the phase-lock loop circuit at said reference frequency;
interrupting a voltage-controlled oscillator of said phase-lock loop circuit while maintaining a phase lock loop parameter to lock in said reference frequency;
multiplexing the input signal to the phase-lock loop circuit; and
resuming operation of the voltage-controlled oscillator at said reference frequency at a particular phase relationship to the input signal.

* * * * *